| United States Patent [19] | [11] Patent Number: 4,478,930 |
| Shiba et al. | [45] Date of Patent: Oct. 23, 1984 |

[54] PRESENSITIZED LITHOGRAPHIC PRINTING PLATES

[75] Inventors: Keisuke Shiba; Sho Nakao; Shigeo Koizumi, all of Shizuoka, Japan

[73] Assignee: Fuji Photo Film Co., Ltd., Kanagawa, Japan

[21] Appl. No.: 439,250

[22] Filed: Nov. 4, 1982

[30] Foreign Application Priority Data

Nov. 5, 1981 [JP] Japan ................................ 56-177610

[51] Int. Cl.$^3$ ................................................ G03C 1/76
[52] U.S. Cl. ..................................... 430/271; 430/273;
430/156; 430/302; 430/278; 430/502; 430/503;
430/908; 430/165; 430/166; 430/167; 430/496;
430/276
[58] Field of Search ............... 430/271, 273, 156, 302,
430/278, 502, 503, 908, 165, 166, 167, 496, 276

[56] References Cited

U.S. PATENT DOCUMENTS

| 4,268,609 | 5/1981 | Shiba et al. | 430/302 |
| 4,275,092 | 6/1981 | Nakayama et al. | 430/302 |
| 4,299,912 | 11/1981 | Shiba et al. | 430/156 |
| 4,345,020 | 8/1982 | Yoneda et al. | 430/302 |

Primary Examiner—Won H. Louie
Attorney, Agent, or Firm—Sughrue, Mion, Zinn, Macpeak & Seas

[57] ABSTRACT

A presensitized lithographic printing plate, which comprises a support having a hydrophilic surface. A non-silver light-sensitive layer capable of having formed therein a lipophilic image pattern and a direct positive light-sensitive silver halide emulsion layer are provided on the support in that sequence. The non-silver light-sensitive layer is provided with an adjacent hydrophilic colloid layer in which a resin is dispersed in fine particle form. The resin is a copolymer comprising (A) a recurring unit derived from at least one monomer of acrylic acid and methacrylic acid, and (B) a recurring unit derived from at least one monomer of an aralkyl acrylate and an aralkyl methacrylate.

11 Claims, No Drawings

PRESENSITIZED LITHOGRAPHIC PRINTING PLATES

FIELD OF THE INVENTION

The present invention relates to presensitized lithographic printing plates with a direct positive type light-sensitive silver halide emulsion layer provided on a non-silver light-sensitive layer.

BACKGROUND OF THE INVENTION

U.S. Pat. No. 4,268,609 discloses a presensitized lithographic printing plate comprising a support having a hydrophilic surface, e.g., an aluminum plate, and a non-silver light-sensitive layer and a negative or direct positive light-sensitive silver halide emulsion layer provided on the support in that sequence, wherein a hydrophilic colloid layer adjacent to the non-silver light-sensitive layer (an embodiment in which the hydrophilic colloid layer is the light-sensitive silver halide emulsion layer is also included) contains a substantially water-insoluble lipophilic resin dispersed therein in finely divided particles.

As preferred examples of the above-described lipophilic resins, resins containing a phenolic hydroxy group, such as a phenol resin, and a mono- or copolymer of hydroxystyrene, are disclosed. With these resins, however, it has been found that although satisfactory results can be obtained when a negative light-sensitive silver halide emulsion layer is used, various problems arise when a direct positive silver halide emulsion layer is used. For example, the sensitivity of the direct positive light-sensitive silver halide emulsion layer is seriously reduced, and minimum density of highlights is increased. As a result, a sharp silver image may not be obtainable. In addition, non-image areas of the lithographic printing plate are stained, printing durability (press life) is degraded and sharpness is reduced.

SUMMARY OF THE INVENTION

As a result of extensive investigations, it has been found that the above problems can be overcome by using, as the resin to be dispersed in fine particle form in a hydrophilic colloid layer which is provided adjacent a non-silver light-sensitive layer, a copolymer containing (A) a recurring unit derived from at least one monomer of acrylic acid and methacrylic acid, and (B) a recurring unit derived from at least one monomer of an aralkyl acrylate(s) and an aralkyl methacrylate(s).

The present invention, therefore, relates to a presensitized lithographic printing plate comprising a support having a hydrophilic surface, and a non-silver light-sensitive layer capable of forming therein a lipophilic image and a direct positive light-sensitive silver halide emulsion layer provided on the support in that sequence, the non-silver light-sensitive layer being provided with an adjacent hydrophilic colloid layer in which a resin is dispersed in fine particle form, wherein the resin is a copolymer containing (A) a recurring unit derived from at least one monomer of acrylic acid and methacrylic acid, and (B) a recurring unit derived from at least one monomer of an aralkyl acrylate(s) and an aralkyl methacrylate(s).

DETAILED DESCRIPTION OF THE INVENTION

The presensitized lithographic printing plate of the invention will hereinafter be explained in detail.

The support with a hydrophilic surface as used herein may be of any conventional material used as a support for a lithographic printing plate. Such supports are described in detail in U.S. Pat. No. 4,268,609.

The non-silver light-sensitive layer capable of forming therein a lipophilic image, which is provided on the support as described above, includes conventional light-sensitive layers which are suitable for use in the preparation of presensitized lithographic printing plates. The term "lipophilic image" as used herein means that the image repels dampening water used in printing, but receives greasy ink.

Typical examples of compositions which can be used to provide such light-sensitive layers include a composition comprising a diazo resin, a composition comprising an o-quinonediazido compound, a composition comprising a light-sensitive azido compound, a photopolymerizable composition comprising an addition-polymerizable unsaturated compound, a photopolymerization initiator and a polymeric compound as a binder, and a composition comprising a polymeric compound containing the group —CH=CH—CO— in the main or side chain thereof. Of these compositions, a composition comprising an o-quinonediazido compound is preferred. These compositions are described in detail in U.S. Pat. No. 4,268,609. The non-silver light-sensitive layer is provided in an amount of from 0.1 to 5 g/m².

The direct positive light-sensitive silver halide emulsion as used herein may be either an emulsion containing silver halide grains which have been uniformly fogged, or an emulsion of the internal latent image type as described in British Patent Laid-Open No. 2,065,318A. Both emulsions are well known in the art. A direct positive light-sensitive silver halide emulsion which is particularly preferred in the practice of the invention is an emulsion containing silver halide grains which have been uniformly fogged. Such emulsions include a silver halide emulsion in which silver halide grains contain free electron trapping nuclei in the interior thereof and are chemically uniformly fogged, a silver halide emulsion in which silver halide grains do not contain positive hole trapping nuclei in the interior thereof and are uniformly chemically fogged, and an emulsion in which silver halide grains contain free electron trapping nuclei in the interior thereof, do not substantially contain positive hole trapping nuclei and are uniformly chemically fogged. These emulsions are described in detail in U.S. Pat. No. 3,854,953.

The direct positive light-sensitive silver halide emulsion is provided on the above-described non-silver light-sensitive layer, directly or through an intermediate layer composed substantially of hydrophilic colloid.

The amount (dry amount) of the direct positive light-sensitive silver halide emulsion coated is from about 1 to 10 g/m², preferably from about 2 to 6 g/m². The amount of silver generally coated is from about 0.1 to 4 g/m², preferably 0.5 to 3 g/m². Coating of the emulsion can be performed by various techniques such as dip coating, air knife coating, curtain coating, hopper coating as described in, for example, U.S. Pat. No. 2,681,294, and extrusion coating.

Preferred examples of hydrophilic colloids which can be used to provide the above-described intermediate layer include polyvinyl pyrrolidone, polyvinyl imidazole, polyacrylamide, polyvinyl alcohol, and their copolymers, and gelatin and its derivatives as described in, for example, U.S. Pat. Nos. 2,614,928, 2,763,639, 3,118,766, and 3,132,945, Japanese Patent Publication Nos. 5514/64 and 26845/67.

In the present invention, a copolymer comprising (A) a recurring unit derived from at least one monomer of acrylic acid and methacrylic acid, and (B) a recurring unit derived from at least one monomer of an aralkyl acrylate and an aralkyl methacrylate is incorporated in the form of finely divided particles, in the hydrophilic colloid layer. The fine divided particles of (A) and (B) are dispersed in the hydrophilic colloid layer which is provided adjacent the non-silver light-sensitive layer, that is, either the direct positive light-sensitive silver halide emulsion layer when the emulsion layer is provided directly on the non-silver light-sensitive layer, or the intermediate layer when the emulsion layer is provided on the non-silver light-sensitive layer through the intermediate layer.

Dispersion of such a copolymer(s) in the hydrophilic colloid layer permits strong adhesion of the hydrophilic colloid layer to the lipophilic surface (in many cases, a water-repellent surface) of the non-silver light-sensitive layer and, further, enables one to uniformly provide the hydrophilic colloid layer in a coverage of from about 0.1 to 3 g/m$^2$. The non-silver light-sensitive layer need not necessarily be a lipophilic surface but it is in the preferred embodiment of the invention and such a surface results when using an o-quinonediazide compound. A hydrophilic surface will result when using a water-soluble cellulose and water-soluble diazo resin. Further, surprisingly, the ultimate lithographic printing plate has image areas exhibiting excellent ink receptivity and has high printing durability. In addition, the use of the above-described copolymer(s) offers the advantages that the sensitivity of the direct positive light-sensitive silver halide emulsion layer is not reduced, a sharp image can be obtained and there is obtained a lithographic printing plate which shows lowered staining.

In the case of a particularly preferred embodiment of the invention, i.e., a presensitized lithographic printing plate in which a direct positive light-sensitive silver halide emulsion layer with the above-described copolymer(s) dispersed therein is provided directly on a non-silver light-sensitive layer, there are obtained the advantages that at each plate-making processing step the emulsion layer is free from scratching and peeling-apart. Further, when washing out the emulsion layer the emulsion can be rapidly removed and no insoluble precipitates result in the washing liquid. The term "washing out" refers to the removal of the silver halide light-sensitive emulsion layer. There may be removal of the areas where a silver image has not been formed (in which case it is necessary for the silver halide development to cause tanning development) or, more preferably, removal of all of the silver halide emulsion layer.

Suitable examples of aralkyl acrylates and aralkyl methacrylates from which recurring unit (B) of the copolymer is derived include benzyl acrylate, benzyl methacrylate, phenethyl acrylate, phenethyl methacrylate, 3-phenylpropyl acrylate and 3-phenylpropyl methacrylate. The proportion of the recurring unit (A) in the copolymer is appropriately from 10 to 50 mol%, more preferably from 25 to 35 mol%. The recurring unit (B) is generally present in an amount of 50 to 90 mol%, preferably 65 to 75 mol%. The copolymer may include another monomer in an amount of 30 mol% or less. The molecular weight of the copolymer used herein is appropriately from about 10,000 to 1,000,000, measured by gel permeation chromatography method.

The copolymer is dispersed and present in the form of finely divided particles in the hydrophilic colloid layer which is provided adjacent the non-silver light-sensitive layer. In this case, the copolymer is first dissolved in, for example, an organic solvent having a solubility in water of 10% by weight or less (e.g., ethyl acetate, butyl acetate, 2-methoxyethyl acetate, etc.) and the resulting solution is then dispersed in an aqueous solution of hydrophilic colloid using an anionic surface active agent, e.g., sodium alkylbenzenesulfonate, taurine derivatives (e.g., sulfonated taurine), Turkey red oil, etc. A high boiling plasticizer, e.g., tricresyl phosphate, dioctyl butyrate, and dodecyl succinate, may be used in combination with the surface active agent in an amount of from 1 to 100% by weight per the weight of the copolymer.

The size of the copolymer particles dispersed in the hydrophilic colloid layer is preferably from 0.01 to 10μ. The amount of the copolymer added is preferably from about 0.1 to 20 parts by weight, preferably from about 1 to 10 parts by weight, per 10 parts by weight of the hydrophilic colloid in the light-sensitive silver halide emulsion, with a range of from about 2 to 5 parts by weight being most preferred.

The aqueous hydrophilic colloid solution with the copolymer dispersed therein is coated on the non-silver light-sensitive layer and dried, advantageously by the method described in U.S. Pat. No. 4,268,609.

Using the presensitized lithographic printing plate of the invention, a lithographic printing plate is prepared as follows:

The presensitized lithographic printing plate is first imagewise exposed to form a latent image in the silver halide contained in the light-sensitive silver halide emulsion layer. Development of the silver halide (First Development) is then performed. The plate is then mixed or, if fixing is omitted, is next exposed overall to actinic light including ultraviolet light and, thereafter, is subjected to Second Development, whereby only non-image areas of the non-silver light-sensitive layer are dissolved and removed to expose the corresponding hydrophilic surface of the support, thereby providing the desired printing plate.

The processing liquid used in the Second Development is required to selectively dissolve only the non-image areas of the non-silver light-sensitive layer. Such processing liquids can be chosen from conventional developers which are used in the development of conventional presensitized lithographic printing plates, or developers similar thereto. For example, when the non-silver light-sensitive layer comprises an o-quinonediazide, an aqueous solution of an alkali metal silicate as described in U.S. Pat. No. 4,259,434 or the developer described in U.S. Pat. No. 4,141,733 can be used.

In accordance with another method, after the presensitized plate is overall exposed to ultraviolet rays in the same manner as in the above-described method, the light-sensitive silver halide emulsion layer on the first layer is removed entirely or only at non-image areas by washing. The plate is then brought into contact with a second developer (as described above) to selectively remove and dissolve only the non-image areas of the non-silver light-sensitive layer. The washing can be carried out with water or an aqueous solution of proteolytic enzyme as described in U.S. Pat. No. 4,299,912 at a temperature preferably in the range of from 20° C. to 60° C.

In addition, a surface-controlling treatment, such as gum-coating or inking, as are commonly used in the production of printing plates using presensitized printing plates can be applied. Further, a conventional processing liquid-replenishing system can be employed.

The following example is given to illustrate the invention in greater detail. All percents (%) are by weight unless otherwise indicated.

EXAMPLE

A 2S aluminum plate which had been mechanically sand grained by the method described in Japanese Patent Application (OPI) No. 33911/73 (the term "OPI" as used herein refers to a "published unexamined Japanese patent application") was dipped in a 2% aqueous solution of sodium hydroxide maintained at 40° C. for 1 minute to etch part of the surface thereof. After washing with water, the plate was dipped in a sulfuric acid-chromic acid mixed solution for about 1 minute to expose the surface of pure aluminum. The plate was then placed in 20% sulfuric acid maintained at 30° C. and was subjected to anodic oxidation at direct current voltage of 1.5 V and a current density of 3 A/dm$^2$ for 2 minutes. The thus-treated plate was washed with water and dried.

A light-sensitive solution having the composition hereinafter described was then coated on the above-treated aluminum plate in a dry amount of about 2 g/m$^2$ using a roll coater to provide a non-silver light-sensitive layer.

| Composition of Non-Silver Light-Sensitive Solution | Amount (g) |
|---|---|
| Naphthoquinone-1,2-diazido(2)-5-sulfonic acid ester of acetone-pyrogallol resin (prepared by the method described in Example 1 of U.S. Pat. No. 3,635,709) | 2.5 |
| Cresol-formaldehyde resin | 5.0 |
| Methyl ethyl ketone | 75 |
| Cyclohexanone | 60 |

A light-sensitive solution having the composition hereinafter described was then coated thereon in a dry amount of about 5.2 g/m$^2$ and dried with hot air having a final temperature of 110° C.

The thus-prepared plate was designated "Sample No. 1".

| Composition of Direct-Positive Light-Sensitive Silver Halide Emulsion Solution | |
|---|---|
| Emulsion prepared by dissolving 20 g of a copolymer of benzyl methacrylate and methacrylic acid (benzyl methacrylate: 70% by weight; methacrylic acid: 30% by weight; molecular weight: about 10,000) in 277 g of ethyl acetate and dispersing the resulting solution in 556 ml of a 10% aqueous gelatin solution by using as a dispersant 10 g of sodium nonylbenzenesulfonate | 1,470 g |
| Direct positive light-sensitive silver halide raw emulsion prepared as described hereinafter | 1,000 g |
| Solution (1/250 mol) of pinakryptol yellow in a 1:1 w/w solution of water and methanol | 144 ml |

| Composition of Direct-Positive Light-Sensitive Silver Halide Emulsion Solution | |
|---|---|
| -continued | |
| Aqueous solution (1%) of glyoxal | 8 ml |

PREPARATION OF DIRECT POSITIVE LIGHT-SENSITIVE SILVER HALIDE RAW EMULSION

To a first solution (prepared by dissolving 10 g of inert gelatin and 5 ml of a 1N solution of sodium chloride in 500 ml by heating at 60° C.) were gradually added a second solution (prepared by dissolving 100 g of silver nitrate in 500 ml of water by heating at 60° C.) and a third solution (prepared by dissolving 23 g of sodium chloride and 23 g of potassium bromide in 150 ml of water, further adding 50 mg of potassium hexachloroirridinate (VI), $K_2IrCl_6$, thereto, and maintaining the resulting mixture at 60° C.) with stirring over a period of 20 minutes. Thereafter, 15 ml of a 0.2N potassium iodide solution was added and, after the temperature was lowered to 17° C., the resulting mass was washed with water. The mass was melted by increasing the temperature to 60° C. and the PAg was adjusted to 4.0 using $AgNO_3$ and KBr, and $10^{-5}$ mol per mol of AgX of hydrazine and $10^{-6}$ mol per mol of AgX of gold chloride were then added. After adjustment of the pH to 10, the mass was aged for 10 minutes and then the pH was adjusted to 6.5 using citric acid. After the temperature was lowered to 17° C., the mass was washed with water. Then, a mixed liquid of molten sodium chloride and molten potassium bromide was added to adjust the PAg to 7.0. Then, a fourth solution (prepared by dissolving 75 g of inert gelatin in 300 ml of water) was added to obtain a silver halide emulsion. The mean grain diameter of the above-obtained silver halide emulsion was 0.15 micron, and substantially all grains were normal tetragonal system grains having a (100) plane.

On the other hand, a light-sensitive solution having the same composition as described above except that the dispersion of the aralkyl acrylate-acrylic acid copolymer was not present was coated in such a manner that the amount of silver halide coated was materially the same, and dried with hot air having a final temperature of 90° C. In this case, however, the light-sensitive layer containing silver halide was partially peeled apart even though the drying temperature was lowered, and there could not be obtained a uniformly coated sample, whereas in the case of Sample No. 1 the light-sensitive layer could be uniformly coated.

The above-prepared plate was designated Sample (a).

Sample No. 1 and Sample (a) were allowed to stand at room temperature for one week. Using each of the plates, a print plate was produced as follows:

A letter original typed on photographic print paper was bonded to a layout sheet to prepare a positive image print. The positive image print was projected onto each of Sample No. 1 and Sample (a) by the use of a plate-making camera (ARTGRAPHICA 601, produced by Dainippon Screen Co., Ltd.) with four 500 watt halogen lamps as light sources at F 11 for 25 seconds. Each plate was then passed through Developer (I) having the composition as described hereinafter at 32° C. for 20 seconds, and Fixer (I) having the composition as described hereinafter at 20° C. for 10 seconds. Subsequently, each plate was passed through an ultraviolet exposure zone, where three reflector type mercury lamps were placed, over a period of 15 seconds, and then through a washing zone where each plate was rubbed with a brush in water maintained at 40° to 45° C. Each plate was then introduced through a squeeze roller into Developer (II) (having the composition as described hereinafter) at 30° C. for 30 seconds to apply a 14° Bé aqueous gum arabic solution, whereby a lithographic printing plate was obtained.

| Composition of Developer (I) | |
| --- | --- |
| Water | 700 ml |
| Metol | 3.0 g |
| Sodium sulfite | 45.0 g |
| Hydroquinone | 12.0 g |
| Sodium carbonate (monohydrate) | 80.0 g |
| Potassium bromide | 2 g |
| Water to make | 1,000 ml |

This was used after being diluted with water in a ratio of ⅓, i.e., 1 part developer composition (I) to 2 parts water by volume.

| Composition of Developer (II) | |
| --- | --- |
| JIS No. 1 sodium silicate | 100 g |
| Sodium metasilicate | 50 g |
| Pure water | 1,800 ml |
| Composition of Fixer (I) | |
| Water | 700 ml |
| Ammonium thiosulfate | 224 g |
| Sodium sulfite | 20 g |
| Water to make | 1 l |

Each plate was mounted on a printing machine, and reproduction was performed. With Sample No. 1, after the fifth sheet was printed, about 110,000 good prints could be obtained. On the other hand, with Sample (a), there were many image line defects due to scratching. Moreover, staining due to edge fog was developed upon cutting Sample (a).

While the invention has been described in detail and with reference to specific embodiments thereof, it will be apparent to one skilled in the art that various changes and modifications can be made therein without departing from the spirit and scope thereof.

What is claimed is:

1. A presensitized lithographic printing plate comprising a support having a hydrophilic surface, and a non-silver light-sensitive layer capable of having formed therein a lipophilic image pattern and a direct positive light-sensitive silver halide emulsion layer provided on the support in that sequence, said non-silver light-sensitive layer being provided with an adjacent hydrophilic colloid layer in which a resin is dispersed in fine particle form, wherein said resin is a copolymer containing (A) a recurring unit derived from at least one monomer acrylic acid and methacrylic acid, and (B) a recurring unit derived from at least one monomer of an aralkyl acrylate and an aralkyl methacrylate, the resin having a particle size of 0.01 to 10 microns, and the amount of the resin being about 1 to 10 parts by weight per 10 parts by weight of hydrophilic colloid.

2. A presensitized lithographic printing plate as claimed in claim 1, wherein the direct positive light-sensitive silver halide emulsion contains silver halide grains which have been uniformly fogged in advance.

3. A presensitized lithographic printing plate as claimed in claim 1, wherein the non-silver light-sensitive layer is provided in an amount of from 0.1 to 5 g/m$^2$.

4. A presensitized lithographic printing plate as claimed in claim 1, wherein the light-sensitive silver halide emulsion layer is provided in an amount of from 2 to 6 g/m$^2$.

5. A presensitized lithographic printing plate as claimed in claim 1, wherein the aralkyl acrylates and aralkyl methacrylates from which recurring unit (B) of the copolymer is derived are selected from the group consisting of benzyl acrylate, benzyl methacrylate, phenethyl acrylate, phenethyl methacrylate, 3-phenylpropyl acrylate and 3-phenylpropyl methacrylate.

6. A presensitized lithographic printing plate as claimed in claim 1, wherein the recurring unit (A) is present in the copolymer in an amount of 10 to 50 mol%.

7. A presensitized lithographic printing plate as claimed in claim 6, wherein the recurring unit (A) is present in an amount of 25 to 35 mol%.

8. A presensitized lithographic printing plate as claimed in claim 1, wherein the recurring unit (B) is present in an amount of 50 to 90 mol%.

9. A presensitized lithographic printing plate as claimed in claim 8, wherein the recurring unit (B) is present in an amount of 65 to 75 mol%.

10. A presensitized lithographic printing plate as claimed in claim 1, wherein the copolymer has a molecular weight within the range of 10,000 to 1,000,000.

11. A presensitized lithographic printing plate as claimed in claim 1, wherein the hydrophilic colloid layer is comprised of a compound selected from the group consisting of polyvinyl pyrrolidone, polyvinyl imidazole, polyacrylamide, polyvinyl alcohol, copolymers of these compounds, gelatin and gelatin derivatives.

* * * * *